United States Patent
Djigo et al.

(10) Patent No.: US 11,079,423 B2
(45) Date of Patent: Aug. 3, 2021

(54) SYSTEM AND METHOD FOR DETECTING AN ELECTRIC ARC

(71) Applicant: COMMISSARIAT A L'ENERGIE ATOMIQUE ET AUX ENERGIES ALTERNATIVES, Paris (FR)

(72) Inventors: Ibrahima Djigo, La Tronche (FR); Mikael Carmona, Tencin (FR); Vincent Heiries, Saint-Jean de Moirans (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 407 days.

(21) Appl. No.: 15/484,291

(22) Filed: Apr. 11, 2017

(65) Prior Publication Data
US 2017/0299647 A1    Oct. 19, 2017

(30) Foreign Application Priority Data

Apr. 14, 2016 (FR) ...................................... 16 53308

(51) Int. Cl.
*G01R 31/12* (2020.01)

(52) U.S. Cl.
CPC ................................ *G01R 31/1209* (2013.01)

(58) Field of Classification Search
CPC ..... G01R 31/1209; G01R 31/00; G01R 31/12
See application file for complete search history.

(56) References Cited

U.S. PATENT DOCUMENTS

| | | | |
|---|---|---|---|
| 6,215,408 B1* | 4/2001 | Leonard | G01R 31/3274 324/415 |
| 9,084,036 B2* | 7/2015 | Jiang | H04R 3/005 |
| 9,594,108 B2 | 3/2017 | Heiries et al. | |
| 2006/0164097 A1 | 7/2006 | Zhou et al. | |
| 2012/0203362 A1* | 8/2012 | Parvaix | G10L 19/008 700/94 |

(Continued)

FOREIGN PATENT DOCUMENTS

| | | |
|---|---|---|
| FR | 2 944 403 A1 | 10/2010 |
| FR | 3 015 045 A1 | 6/2015 |
| WO | WO 2015/100577 A1 | 7/2015 |

OTHER PUBLICATIONS

French Preliminary Search Report dated Dec. 12, 2016 in French Application 16 53308 filed on Apr. 14, 2016.

(Continued)

*Primary Examiner* — Regis J Betsch
*Assistant Examiner* — Jeremy A Delozier
(74) *Attorney, Agent, or Firm* — Oblon, McClelland, Maier & Neustadt, L.L.P.

(57) ABSTRACT

The invention concerns a method and a system for detecting an electric arc in an electrical installation (7) equipped with at least one sensor (5) capable of detecting temporal acoustic signals produced by the electrical installation (7), said method being characterised in that it comprises a device for analysis (3) configured to analyse any temporal acoustic signal (5) coming from said one or more sensors (5) by associating with said acoustic signal a corresponding parsimony measurement (m) whose value indicates whether the acoustic signal is an electrical arc signature or not.

11 Claims, 10 Drawing Sheets

(56) References Cited

U.S. PATENT DOCUMENTS

2016/0320442 A1* 11/2016 Perichon .................. B60L 3/00
2016/0341782 A1* 11/2016 Huang ................. H02H 1/0023

OTHER PUBLICATIONS

Si Mohamed Aziz Sbai "Traitement des signaux parcimonieux et applications," Traitement du signal et de l'image, Telecom Bretagne, Universite de Bretagne Occidentale, https://tel.archives-ouvertes.fr/tel-00789538, HAL Id: tel-00789538, 2012, pp. 119 (Blank pages have been removed).

* cited by examiner

SYSTEM AND METHOD FOR DETECTING AN ELECTRIC ARC

TECHNICAL FIELD

The present invention relates to the field of detection of an electric arc and more particularly the detection of an electric arc from its acoustic signature.

THE STATE OF THE PRIOR ART

An electric arc may be produced, for example, by a break in a cable, by a defective connection element or when two contacts that are initially passing an electric current are separated. The appearance of electric arcs that are sustained over time in elements for the storage, distribution, transportation or use of electricity could possibly result in degradation of these electrical elements and neighbouring equipment. Electric arcs are particularly hazardous in installations which operate using direct current, insomuch as the current remains sustained over time without passing through a zero value. Thus in order to guard against the risk of propagation of electrical arcs, early detection of their formation is a major benefit for the operational safety and security of electrical systems or installations.

Various solutions have been proposed for detecting the beginnings of an electric arc. Most of these solutions are based on measurement of the electrical current in the line supplying the electrical element. In effect, when an electrical arc appears, the current increases significantly and may exceed several times the nominal current. In certain electrical installations, however, the electrical current may be perturbed by electrical loads upstream of a generator and may consequently result in false detection and cause false alarms.

Other promising solutions are based on measurements of acoustic signals, given that the latter accompany the formation of an electric arc. These solutions conventionally use temporal and frequency-base signal processing to analyse the measured acoustic signal in order to identify a signature of an electric arc. Methods of this sort however require complex adjustment of a plurality of parameters and other threshold values, thus complicating their implementation. In addition they often require significant calculation resources, which may be a particular constraint, for example, in an electrical system on board an aircraft.

The objective of the present invention is consequently to propose a system and a method of detecting an electric arc that is simple to implement and which is capable of detecting, with precision and reliability, any appearance of an electric arc in an installation, without exhibiting the aforementioned drawbacks.

DESCRIPTION OF THE INVENTION

The present invention is defined by a system for detecting an electric arc in an electrical installation equipped with at least one detector capable of detecting temporal acoustic signals produced by the electrical installation, said system comprising an analysis device configured to analyse any temporal acoustic signal coming from said one or more sensors by associating with said acoustic signal a corresponding parsimony measurement whose value indicates whether said acoustic signal is the signal from an electric arc or not, where the analysis device is configured to determine said parsimony measurement by sampling said acoustic signal to form a sampled signal, by compressing the sampled signal to form a compressed signal and by reconstructing the sampled signal from said compressed signal.

This system allows an electric arc to be detected with precision from a single parameter which is the parsimony of the acoustic signal, thus minimising the adjustments and calculation resources whilst providing very good discrimination between an electric arc and an interference event. It will be noted that the fact that there is only one parameter allows the system to be adjusted very easily, unlike the state of the art in which it is necessary to carry out a plurality of adjustments of all types.

Advantageously, the analysis system comprises:

a pre-conditioning circuit configured to transform said temporal acoustic signal into a sampled signal f of predetermined dimension N ($f \in R^N$) and expressed in a temporal base, a processor configured to determine the parsimony measurement of said acoustic signal by calculating a parsimony probability of the corresponding sampled signal f and to detect whether said parsimony probability exceeds a predetermined threshold value, where exceeding said threshold value represents a signature of an electric arc.

This allows an electric arc to be easily distinguished from another event, with the acoustic signal being an electric arc if the parsimony probability is simply greater than said predetermined threshold value.

According to one embodiment of the present invention, said processor is configured to:

compress the sampled signal f iteratively by multiplying it at each current iteration by a random acquisition matrix $\varphi$ which differs at each iteration, forming a sub-sampled current signal y of dimension M with M<N, calculate, from the current sub-sampled signal y, a current reconstruction sampled signal $\hat{f}$ by seeking a solution which minimises a predetermined norm $l_1$ measuring the parsimony of the sampled signal, identify a predetermined number k of current estimated temporal positions $\hat{p}_1, \ldots, \hat{p}_k$ of the greatest amplitudes of the sampled reconstruction signal $\hat{f}$, determine the parsimony probability $P_L$ of said sampled signal f by calculating the proportion of the number of iterations during which the estimated temporal positions $\hat{p}_1, \ldots, \hat{p}_k$ of the greatest amplitudes of the sampled reconstruction signal $\hat{f}$ are concordant with the true temporal positions $p_1, \ldots, p_k$ of the greatest amplitudes of the sampled signal f, compare said parsimony probability $P_L$ with said predetermined threshold value, said acoustic signal being a signature of an electric arc if the parsimony probability $P_L$ is greater than said predetermined threshold value.

Thus the parsimony of a sampled signal f is measured in a robust and effective manner by the astute use of a "compressed sensing" algorithm.

According to one particular feature of the present invention, said predetermined number k is equal to one and in this case said processor is configured to:

identify a current estimated temporal position of the maximum amplitude of the sampled reconstruction signal $\hat{f}$, and determine the parsimony probability $P_L$ of said sampled signal f by calculating the proportion of the number of iterations during which each estimated temporal position of the maximum amplitude of the sampled reconstruction signal $\hat{f}$ is concordant with the true temporal position of the maximum amplitude of the sampled signal f.

This allows the parsimony of a sampled signal f to be measured precisely whilst minimising the calculation steps.

According to another embodiment of the present invention, said processor is moreover configured to express the sampled signal f before it is compressed in another orthonormal base in which it is parsimonious, by using a transfer matrix ψ (f=ψx).

This allows the use of a base in which the sampled signal f is parsimonious and thus covers exceptional cases in which the acoustic signal caused by an electric arc is not parsimonious in a temporal base.

Advantageously, the pre-conditioning circuit comprises:
 a modulator, configured to form a modulated acoustic signal by modulating said acoustic signal according to a predetermined central frequency and a predetermined frequency band,
 a low-pass filter, configured to form a filtered acoustic signal by performing low-pass filtering according to a predetermined cut-off frequency on said modulated acoustic signal, and
 a sampler, configured to sample the filtered acoustic signal at a sampling frequency equal to or greater than double the cut-off frequency thus forming said sampled signal f.

The pre-conditioning circuit drastically reduces the sampling frequency and therefore the amount of data to be processed.

Advantageously, said one or more sensors is selected such that its gain diagram exhibits a maximum gain within the predetermined frequency band.

Thus the gain of the sensor is a maximum in the band of characteristic frequencies of an electric arc.

Advantageously, said modulator is configured to form the modulated acoustic signal by performing band-pass filtering on the acoustic signal according to the predetermined frequency band and by multiplying it by a cosine function of the predetermined central frequency and zero phase shift.

Advantageously the predetermined central frequency has a value between 30 kHz and 200 kHz and preferably equal to about 100 kHz, where the predetermined frequency band has a value between 10 kHz and 50 kHz and preferably equal to about 20 kHz, where the cut-off frequency is about 5 kHz and where the sampling frequency is about 10 kHz. These values are given for indication purposes and are not restrictive.

Advantageously the electrical installation comprises a set of electrical elements each equipped with a specific sensor thus allowing the electrical element at the location wherein the electric arc is produced to be identified.

Another aim of the invention is a method for detecting an electric arc in an electrical installation equipped with at least one sensor capable of detecting temporal acoustic signals produced by the electrical installation, where said method comprises an analysis of any temporal acoustic signal coming from said one or more sensors by associating a corresponding parsimony measurement with said acoustic signal, whose value indicates whether said acoustic signal is an electric arc signature or not.

BRIEF DESCRIPTION OF THE ILLUSTRATIONS

Other characteristics and advantages of the invention will become apparent on reading the preferential embodiments of the invention whilst referring to the attached figures, among which:

FIG. 1 schematically shows a system and a method for detecting an electric arc in an electrical installation, according to one embodiment of the invention;

FIG. 2 schematically shows a detection system according to a preferred embodiment of the invention;

DETAILED DESCRIPTION OF PARTICULAR EMBODIMENTS

The basic concept of the invention relies solely upon the analysis of the parsimony of the acoustic signal in a base of predetermined frequencies.

Figure 1:
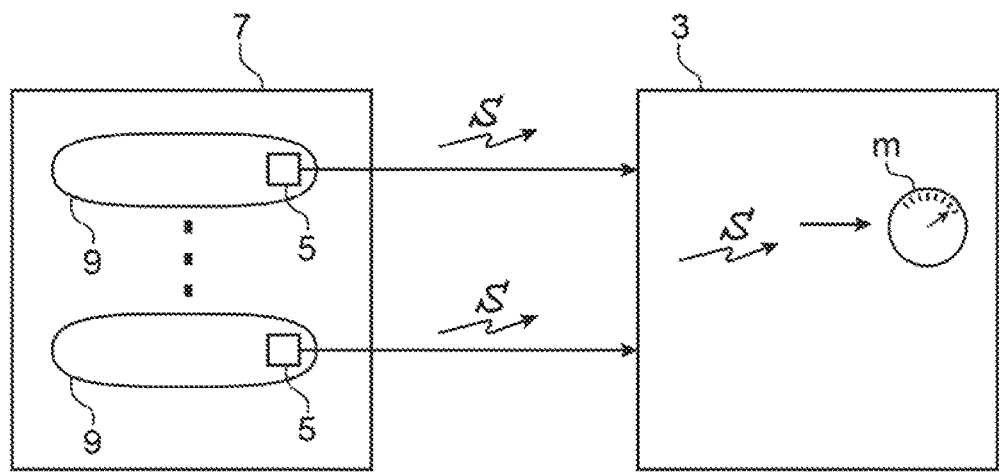

FIG. 1 schematically shows a system and a method for detecting an electric arc in an electrical installation, according to one embodiment of the invention.

The detection system 1 is implemented by an analytical device 3 as well as by at least one acoustic sensor 5 capable of detecting temporal acoustic signals produced by the electrical installation 7.

Advantageously, the electrical installation 7 is equipped with a plurality of acoustic sensors 5 in order to monitor different parts of the installation. In effect, the electrical installation 7 comprises in general an assembly of electrical elements 9 and each acoustic sensor 5 is then arranged on the electrical element 9 that it is wished to monitor. An acoustic sensor 5 may be made up of one or more transducers in a band ranging from a few hertz to several hundred kHz. The various acoustic sensors 5 are individually connected to the analysis device 3 and each acoustic sensor 5 is capable of delivering to the latter a temporal acoustic signal S representing the variation over time of the amplitude of the sound wave that it has detected.

In accordance with the invention, the analysis device 3 is configured to analyse any temporal acoustic signal S coming from one or more of the sensors 5 by associating with each acoustic signal S a corresponding parsimony measurement m whose value indicates whether the acoustic signal is a signature of an electric arc or not.

Indeed, an acoustic wave S may be emitted not only by an electric arc but also by other types of events that occur in the electrical installation and in particular by a mechanical impact, given that the latter can occur during normal use of the electrical installation. One particular feature of an acoustic wave generated by an electric arc, however, is that it may be regarded as being parsimonious in time within a certain frequency band (see FIG. 3B), whereas that generated by a mechanical impact is not (see FIG. 3A). Thus by evaluating the parsimony of each acoustic signal S, the analysis device 3 is capable of discriminating with a high degree of precision between an electric arc and a mechanical impact or if applicable any other interference event. Thus measuring a single parameter (i.e. the magnitude of the parsimony of the acoustic wave) allows the initiation of an electric arc in an electrical installation 7 to be detected rapidly and in a robust and reliable manner.

Figure 2:
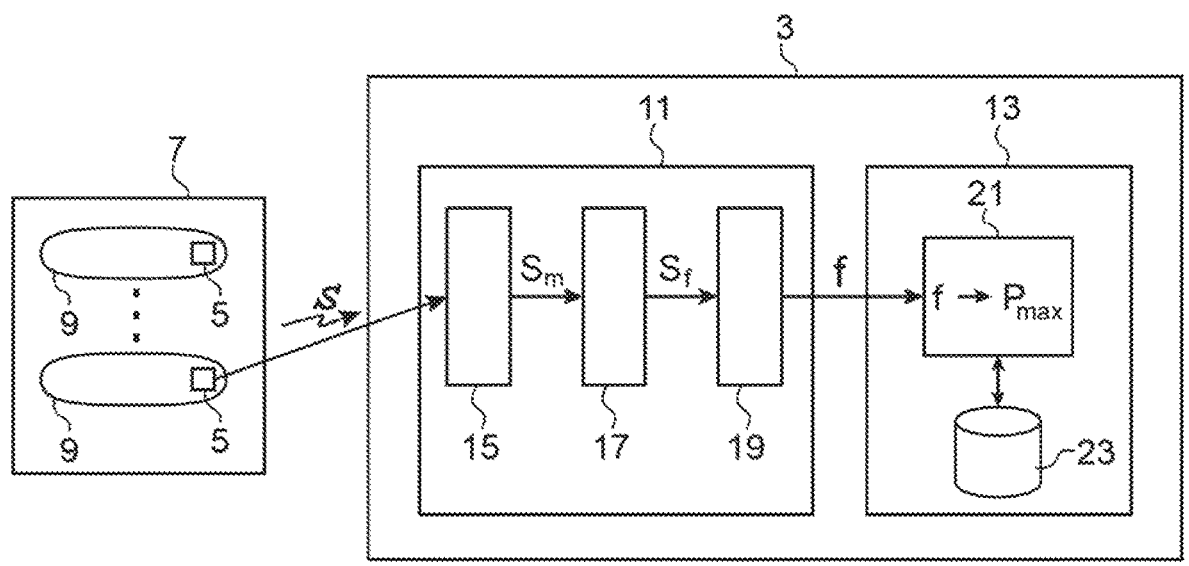

FIG. 2 schematically shows a detection system according to a preferred embodiment of the invention.

According to this embodiment the analytical device 3 comprises a pre-conditioning circuit 11 and a data-processing circuit 13.

The pre-conditioning circuit 11 is configured to transform the temporal acoustic signal S acquired from a sensor 5 into a sampled digital signal f which offers a reduced amount of data in comparison with the initial acoustic signal S. This sampled digital signal f corresponds to a vector of predetermined dimension N (i.e., $f \in R^N$) expressed in an ortho-normal temporal base.

Advantageously the pre-conditioning circuit 11 comprises a modulator 15, a low-pass filter 17 and a sampler 19.

The modulator 15 is configured to receive the temporal acoustic signal S from the sensor 5 and to modulate this acoustic signal S in a base-band according to a central predetermined frequency $v_0$ and a predetermined frequency band B. Thus at its output the modulator 15 issues a modulated acoustic signal $S_m$.

Advantageously the modulator 15 comprises an analogue circuit configured to carry out band-pass filtering on the acoustic signal S according to the predetermined frequency band B by multiplying it by a cosine function of zero phase-shift and of predetermined central frequency $v_0$. In effect the modulator 15 may comprise an appropriate sinusoidal oscillator circuit in order to carry out an operation involving multiplication by a cosine function. The oscillator circuit is very stable and can be selected from a Clapp LC oscillator, negative resistance oscillator, phase-shift network oscillator etc.

The predetermined central frequency $v_0$ advantageously corresponds to a value between 30 kHz and 200 kHz and preferably equal to about 100 kHz. Furthermore the predetermined frequency band B advantageously has a value between 10 kHz and 50 kHz and preferably equal to about 20 kHz.

The central frequency $v_0$ and the frequency band B are selected in a characteristic domain for electric arcs and in which the acoustic signal S coming from an electric arc is particularly parsimonious in time, whereas an acoustic signal that is produced by a mechanical impact is not. The frequency band B is selected around a central frequency $v_0$ that is sufficiently high (i.e. greater than 10 kHz) not to be perturbed by low frequency interference whilst still remaining not very high (i.e. less than 200 kHz) in order to avoid attenuation of the signal. The modulation thus allows the sampling frequency to be minimised whilst focussing on a frequency band that is characteristic of electric arcs.

Moreover, each acoustic sensor 5 is advantageously selected in such a way that its gain diagram exhibits a maximum gain in the predetermined frequency band B so that the response of the acoustic sensor 5 is optimised and so that there is very little interference present in this band B.

The low-pass filter 17 advantageously comprises an analogue circuit configured to perform low-pass filtering according to a predetermined cut-off frequency $v_c$, on the modulated acoustic signal $S_m$ received from the modulator 15. At its output, the low-pass filter 17 issues a modulated and filtered acoustic signal $S_f$ (called the filtered acoustic signal in what follows). The cut-off frequency $v_c$ is associated with the selected frequency band and may be equal to about 5 kHz. The filtering is used to further clean the signal of any interference which may cause a hindrance outside the cut-off frequency $v_c$.

The low-pass filtering can be performed using a simple 2nd order Butterworth filter. Advantageously this type of filter exhibits a gain which is quite flat in its pass-band. Furthermore, it is very easy to make using an operational amplifier, two identical resistances and two capacitances (not shown). Moreover, the attenuation of the signal to be filtered is already quite high just after the 5 kHZ frequency, which allows the low frequency information desired to be retrieved even with a filter of very low order.

Advantageously the use of a chain of analogue circuits (i.e. modulator 15 and low-pass filter 17) by the pre-conditioning circuit allows the amount of data to be numerically processed to be minimised.

In addition the sampler 19 is configured for sampling the filtered acoustic signal $S_f$ received from the low-pass filter 17 at a sampling frequency $v_e$ that is equal to or greater than double the cut-off frequency $v_c$. At its output the sampler 19 delivers the sampled digital signal f. The sampling frequency $v_e$ is chosen depending on the cut-off frequency $v_c$ whilst meeting the Shannon constraint in order to prevent spectrum aliasing. As an example, the sampling frequency is double the cut-off frequency ($v_e = 2 \times v_c$). Thus for a cut-off frequency $v_c = 5$ kHz, the sampling frequency $v_e = 10$ kHz. Advantageously the sampler 19 comprises an analogue-digital converter and an anti-aliasing filter to prevent spectrum aliasing before sampling at 10 kHz.

It will be noted that an acoustic emission from an electric arc of 500 kHz would require a high sampling frequency of 1 MHz if the Shannon theorem is to be complied with. The operations according to the invention, however (those of bandpass filtering, translation to a base-band and low-pass filtering at about 5 kHz) allow the sampling frequency of 1

MHz to be reduced to only 10 kHz, thus representing a reduction in the amount of data to be processed by a factor of 100.

Figure 3A:
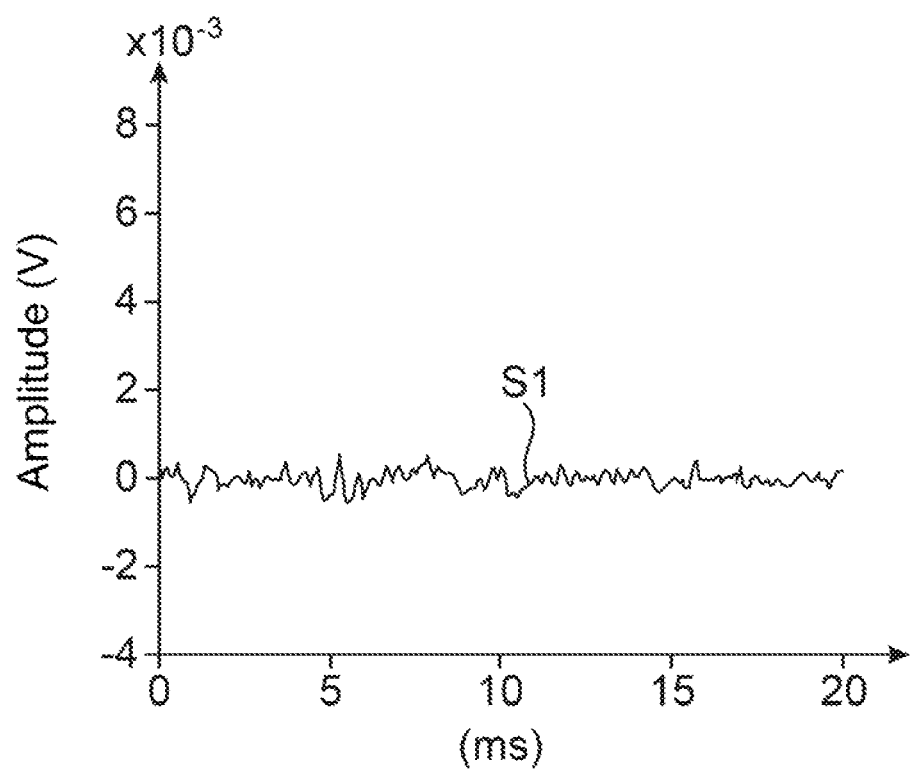
FIG. 3A shows a reduction of the sampling frequency due to the operations of a circuit for pre-conditioning the acoustic signals coming from a mechanical impact and an electric arc, according to the invention.
Figure 3B:
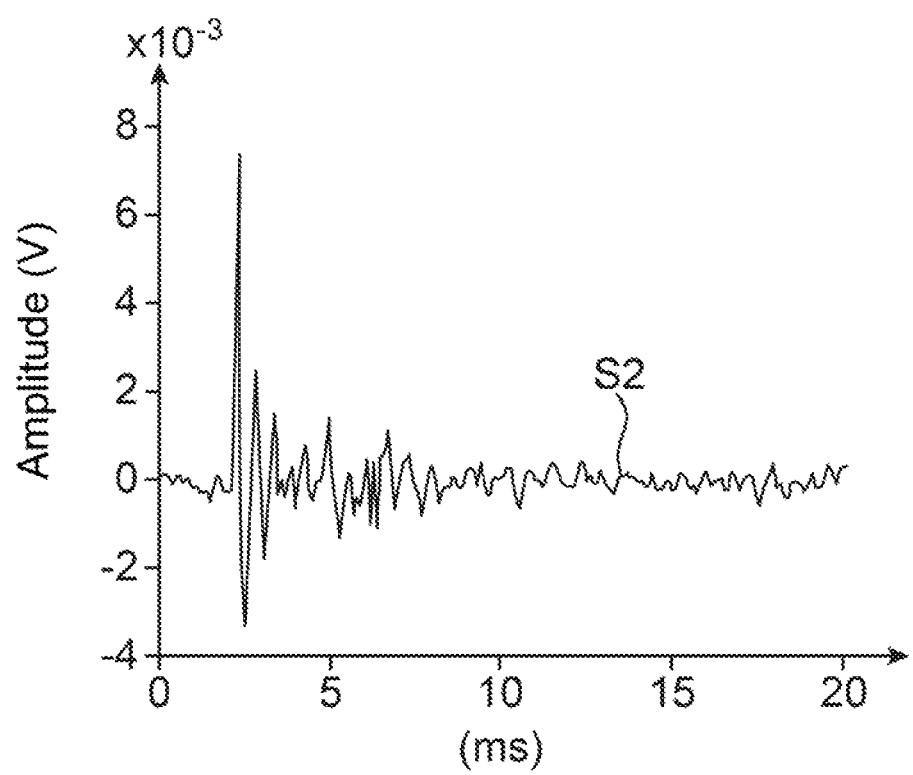
FIG. 3B is another view of the reduction of the sampling frequency due to the operations of a circuit for pre-conditioning the acoustic signals coming from a mechanical impact and an electric arc, according to the invention.

In effect, the examples in FIGS. 3A and 3B show clearly the reduction of the sampling frequency using the operations of a circuit for pre-conditioning of the acoustic signals S1 and S2 coming from a mechanical impact (FIG. 3A) and from an electric arc (FIG. 3B).

It can also be seen that in FIG. 3A the acoustic signal S1 from a mechanical impact exhibits a noise structure, whereas in FIG. 3B the acoustic signal S2 from an electric arc exhibits a structure which is quasi-parsimonious in time. In effect, the acoustic signal S2 in FIG. 3B shows four coefficients (or peaks) which have amplitudes greater than those of the other coefficients.

Furthermore, the circuit 13 for processing data comprises a processor 21 and means of storage 23. These latter comprise a computer programme that can be executed by the processor 21 and which comprises code instructions suitable for implementing a method for measuring parsimony in acoustic signals S in order to detect any electric arcs, according to the invention.

In effect, the processor 21 is configured to determine the parsimony measurement of the acoustic signal S by calculating a parsimony probability $P_{Lmax}$ of the corresponding sampled signal f. Furthermore the processor 21 is configured to detect a value of the parsimony probability $P_{Lmax}$ which exceeds a predetermined threshold value given that the crossing of the threshold value represents the signature of an electric arc. Thus the value of the parsimony probability of the sampled signal f allows an acoustic signal from an electric arc to be distinguished easily from another signal coming from a mechanical impact.

Figure 4A:
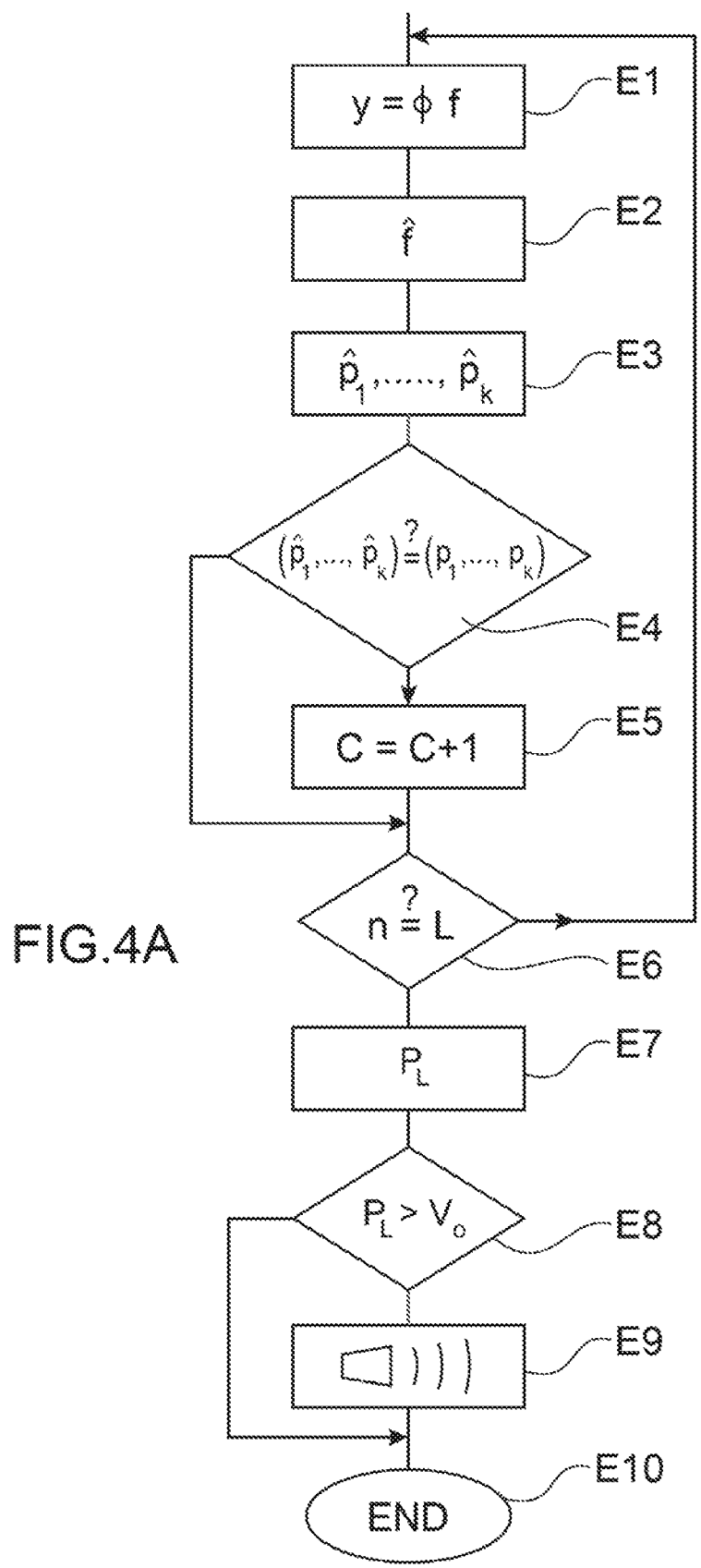
FIG. 4A is a flow chart showing a method for determining the parsimony measurement of the acoustic signal by a processor, according to a preferred embodiment of the invention.

FIG. 4A is a flow chart showing a method for determining the parsimony measurement of the acoustic signal by the processor, according to a preferred embodiment of the invention.

Steps E1 to E6 form an iterative loop carried out a predetermined number of times L. In particular these steps are an astute application of a compressive sensing algorithm to the sampled signal f to determine the parsimony of this signal. The compressive sensing acquisition technique states that if a signal f is originally parsimonious, it is then possible to reconstruct this signal f from a small number of acquisitions. Here the compressive sensing technique is used in a manner which has moved away from its original purpose, that is, no longer with the aim of reconstructing a signal, but rather to measure the parsimony of this signal. Thus the steps in this flow-chart first of all involve compressing the sampled signal f and then reconstructing it from the compressed signal in order to establish whether or not the reconstructed signal is concordant or corresponds well with the original sampled signal f, given that good concordance between the two signal is an indicator of the parsimony of the original sampled signal f.

In effect, at each iteration of the steps E1 and E2, the sampled signal f received from the pre-conditioning circuit 11 is sub-sampled before being reconstructed in accordance with the compressive sensing technique.

More specifically, at step E1, the processor 21 is configured to compress the sampled signal f (belonging to $R^N$) in an iterative manner in accordance with a predetermined number of iterations L. Compression is achieved by multiplying the sampled signal f by a random acquisition matrix φ (i.e. generated randomly at each iteration) at each current iteration n. In other words the scalar product is made of the sampled signal f and M waveforms $\{\emptyset_k\}_{k=1 \ldots M}$ which gives M measurements referred to as $y_k = \langle f, \emptyset_k \rangle$, k=1 ... M where M<N. It will be noted that the acquisition matrix φ is different at each iteration due to the fact that it is generated randomly at each iteration.

Thus in step E1 the compression of the sampled signal f forms, at each current iteration n, a current sub-sampled signal y of dimension M (i.e. with a compression ratio of $$T_c = \frac{N}{M}).$$

The sub-sampled signal y is thus the correlation of the sampled signal f with the waveforms $\{\emptyset_k\}_{k=1 \ldots M}$. If these waveforms are, for example, Dirac pulses over time, then the signal y is a sampled version of the signal f in the temporal domain.

The sub-sampled signal $y=(y_1, y_2, \ldots, y_M)$ can thus be written in the form y=φf where the acquisition matrix φ (of dimension M×N) is randomly generated at each iteration in accordance with a random realisation equation (for example of the Bernoulli, Gaussian or uniform type etc.). By way of an example, the values of the coefficients of the acquisition matrix φ can be generated randomly from only two values (for example, +1 and −1).

At step E2 the processor 21 is configured to calculate the coefficients of a current sampled reconstruction signal $\hat{f}$ at each current iteration, from the sub-sampled signal y and the current acquisition matrix φ. This involves solving a sub-determined system of M equations with N unknowns to establish an estimate of the initial sampled signal f.

The compressive sensing technique states that if a signal f is parsimonious of order S in an orthonormal base, it is then possible to reconstruct the signal f exactly. More specifically, if the signal f sampled from $R^N$ is almost zero at any point except at S values, where S<<N, then the coefficients of a sampled reconstruction signal $\hat{f}$, can be calculated under the following condition:

$$M \geq M_{min} = C_\phi \cdot S \log\frac{N}{S}$$

where $C_\emptyset$ is a constant dependant on the acquisition matrix φ chosen. It can be seen that the values of the coefficients of the acquisition matrix φ can be chosen randomly, as long as the above condition is met.

So if the current sub-sampled signal y and acquisition matrix φ are known, the sampled reconstruction signal $\hat{f}$ can be calculated by seeking a solution which minimises a predetermined norm $l_1$ which measures the parsimony of the sampled signal f. This amounts to using known methods for minimisation of the norm $l_1$ in order to seek the solution of the following equation:

$$\hat{f} = \operatorname{argmin}_f \|f\|_1 \text{ such that } y=\varphi f.$$

Figure 5A:
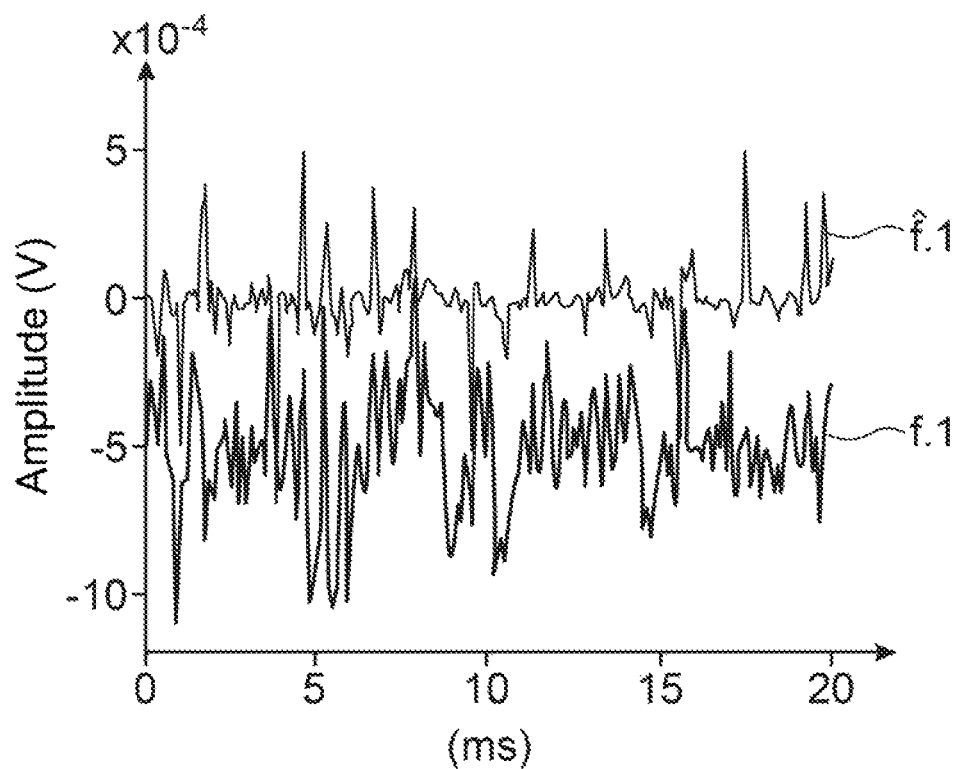
FIG. 5A shows the reconstruction signals for those shown in FIGS. 3A and 3B, according to the invention.
Figure 5B:
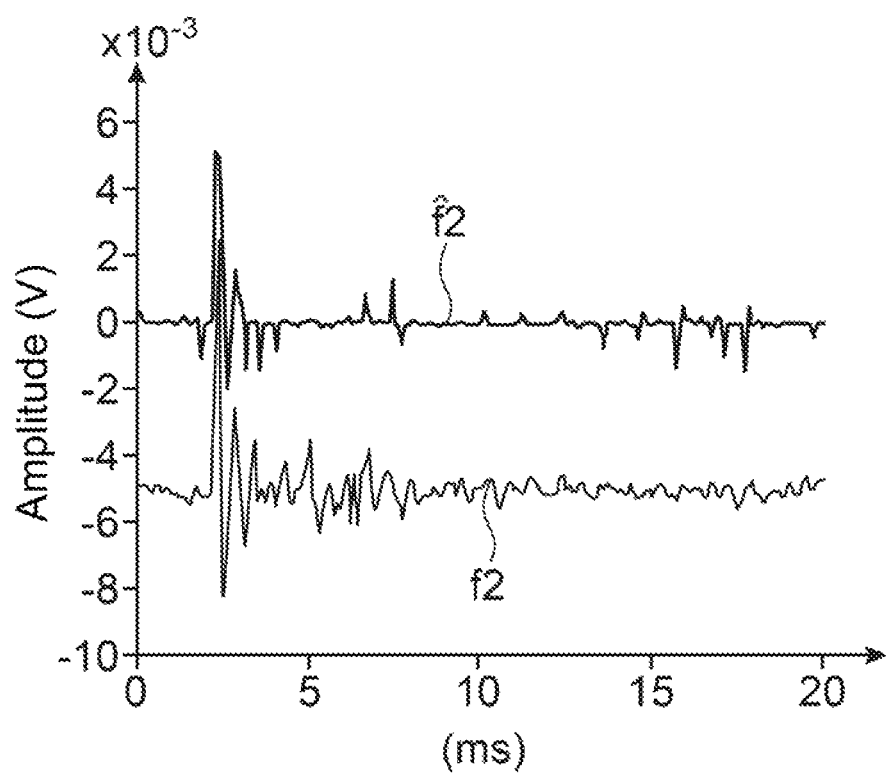
FIG. 5B is another view of the reconstruction signals for those shown in FIGS. 3A and 3B, according to the invention.

FIGS. 5A and 5B show the signals from reconstruction of those shown in FIGS. 3A and 3B. These graphs show a reconstruction of each of the acoustic signals S1 and S2 coming from mechanical impact signals and an electric arc with a compression ratio of $T_c=4$. More specifically, FIG. 5A shows the signal f1 sampled from the acoustic signal S1 (of FIG. 3A) as well as the sampled reconstruction signal $\hat{f}1$. FIG. 5B shows the signal f2 sampled from the acoustic signal S2 (of FIG. 3B) as well as the sampled reconstruction signal $\hat{f}2$. It is clearly seen that with only a compression ratio of $T_c=4$, the main peaks of the signal $\hat{f}2$ produced from an electric arc have been reconstructed, which is not the case for the signal $\hat{f}1$ produced from a mechanical impact.

Once the coefficients of the sampled reconstruction signal $\hat{f}$ have been calculated, the steps E3 to E8 involve verification of the concordance of this signal $\hat{f}$ with the original sampled signal. This involves comparing the temporal position of one or more specific peaks for the sampled reconstruction signal $\hat{f}$ with those of one or more corresponding peaks of the sampled signal f. In effect, at step E3 the processor 21 is configured to identify a predetermined number k of current estimated temporal positions $\hat{p}_1, \ldots, \hat{p}_k$ which index the greatest amplitudes of the sampled reconstruction signal $\hat{f}$. The predetermined number k may be, for example, between 1 and 10.

Step E4 is a test in which the processor 21 is configured to compare these estimated temporal positions $\hat{p}_1, \ldots, \hat{p}_k$ of the greatest amplitudes for the sampled reconstruction signal $\hat{f}$ with the actual temporal positions $p_1, \ldots, p_k$ of the greatest amplitudes of the original sampled signal. If the positions are identical, one moves on to step E5 and if not one moves directly to step E6.

At step E5 the processor 21 is configured to increment a concordance counter C, initialised at zero, by one. Thus each time that the estimated positions $\hat{p}_1, \ldots, \hat{p}_k$ are the same as the actual positions $p_1, \ldots, p_k$, the counter C is incremented.

Step E6 is a test to establish whether the current iteration n has reached the predetermined number of iterations. If it has, step E7 is performed and otherwise step E1 is started again.

At step E7, the processor 21 is configured to determine the parsimony probability $P_L$ of the sampled signal f by calculating the quotient (or a concordance level) between the value of the concordance counter C and the total number of iterations L (i.e. the total number of reconstructions carried out). Thus the parsimony probability $P_L$ is defined by a congruence measurement representing the proportion of the number of iterations during which the estimated temporal positions $\hat{p}_1, \ldots \hat{p}_k$ are concordant with the true temporal positions $p_1, \ldots, p_k$ of the greatest amplitudes of the sampled signal f. Advantageously, the fact that the compression and construction are carried out a number of times averages out the error and consequently improves the precision of the parsimony probability $P_L$.

It will be seen that for a given compression ratio, the more parsimonious a signal is, the easier it is to accurately reconstruct, and conversely the less parsimonious it is, the more difficult its reconstruction becomes. The comparison, therefore, between the estimated temporal positions and the real temporal positions of a few peaks (for example, those which have the greatest amplitudes) of the sampled signal f can be used to discriminate, robustly and precisely, between an acoustic signal generated by an electric arc and another signal generated by a mechanical impact or any other interference event.

Step E8 is a test in which the processor 21 is configured to compare the parsimony probability $P_L$ with the predetermined threshold value $V_0$. If the parsimony probability $P_L$ is greater than said predetermined threshold value $V_0$, one moves on to step E9 and if not one moves on to step E10.

At step E9, the processor 21 is configured to trigger an alarm which indicates that the acoustic signal detected is a signature of an electric arc, since the parsimony probability $P_L$ has exceeded the predetermined threshold value $V_0$. By way of an example, the predetermined threshold value $V_0$ can be chosen to be equal to 50%.

Step E10 brings the analysis of the acoustic signal S received from the pre-conditioning circuit 11 to an end.

Figure 4B:
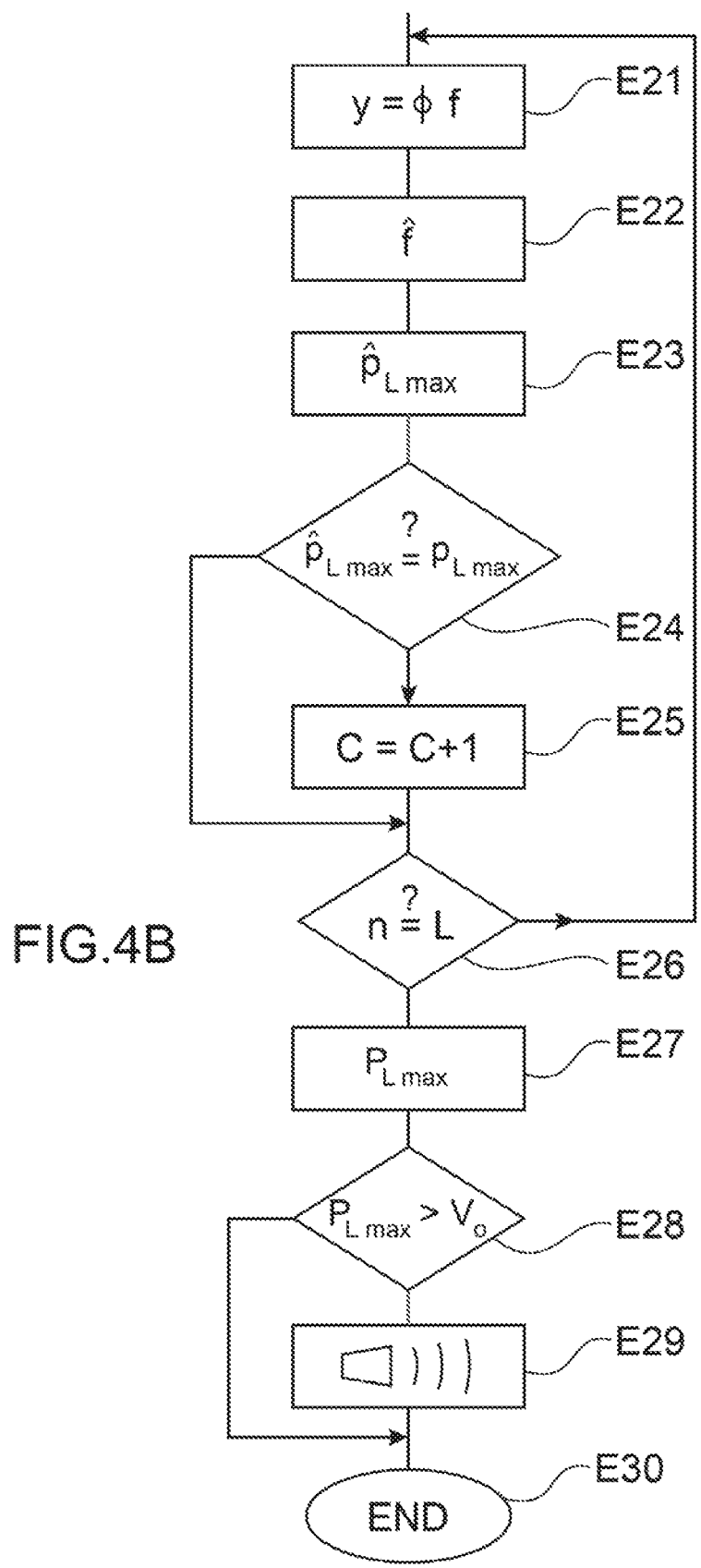
FIG. 4B is a flow chart showing a method for determining the parsimony measurement of the acoustic signal, according to a specific embodiment of that of FIG. 4A.

FIG. 4B is a flow chart showing a method for determining the parsimony measurement of the acoustic signal by the processor, according to a specific embodiment of that of FIG. 4A.

The flow chart in FIG. 4B differs from that of FIG. 4A only by the fact that a predetermined number k of temporal positions that is equal to 1 is chosen. In other words, a comparison is made between the estimated temporal position and the true temporal position of a single peak (for example the one that exhibits maximum amplitude) of the sampled signal f. This comparison is sufficient to discriminate precisely between an acoustic signal generated by an electric arc and another signal generated by a mechanical impact.

Steps E21 and E22 are identical to steps E1 and E2 respectively of FIG. 4A

At step E23, the processor 21 is configured to identify the current estimated temporal position $\hat{p}_{Lmax}$ of the maximum amplitude of the sampled reconstruction signal $\hat{f}$.

At step E24, the processor 21 is configured to compare this estimated temporal position (current) $\hat{p}_{Lmax}$ of the maximum amplitude of the sampled reconstruction signal $\hat{f}$ with the true temporal position $p_{Lmax}$ of the maximum amplitude of the original sampled signal. As previously, if the positions are identical one moves on to step E25 and if not one moves directly to step E26.

Steps E25 to E30 are almost the same as steps E5 to E10 respectively of FIG. 4A.

In effect, at step E25, each time that the estimated position $\hat{p}_{max}$ is the same as the true position $p_{max}$, the concordance counter C is incremented.

Step E26 is a test to establish whether the current iteration n has reached the predetermined number of iterations.

At step E27, the processor 21 is configured to determine the parsimony probability $P_L$ of the sampled signal f by calculating, as before, the quotient between the value of the concordance counter C and the total number of iterations. Here the parsimony probability $P_L$ corresponds to the proportion of the number of iterations during which each estimated temporal position $\hat{p}_{max}$ is concordant with the true temporal position $p_{max}$ of the maximum amplitude.

Steps E28 to E30 are the same as steps E8 to E10 respectively of FIG. 4A.

FIGS. 6A to 8B are examples which show the application of the pre-conditioning steps in FIG. 2 and of those in the flow-chart of FIG. 4 on different unknown acoustic signals.

Figure 6A:
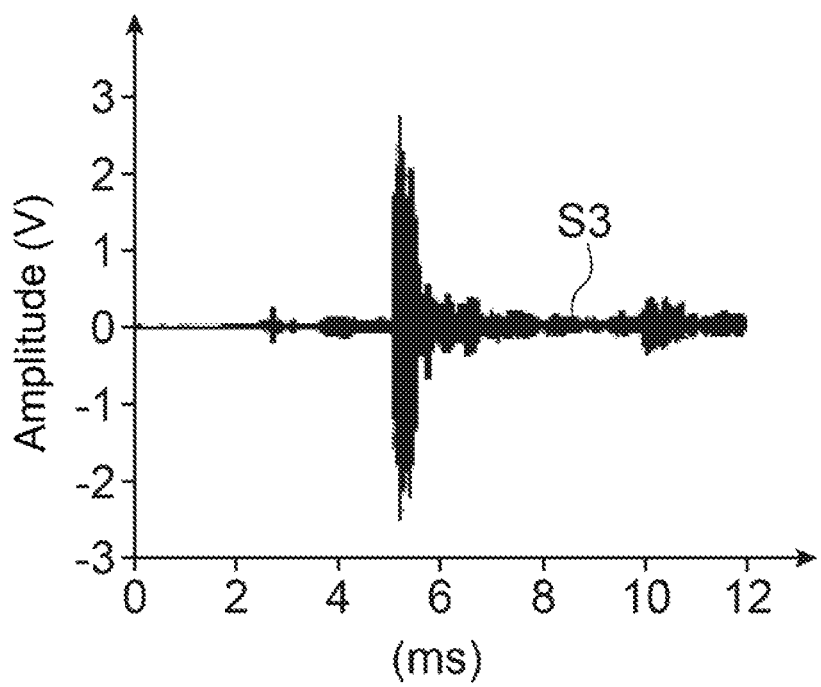
FIG. 6A shows the application of the pre-conditioning steps in FIG. 2 and of those in the flow-chart of FIG. 4 on different unknown acoustic signals, according to the invention.
Figure 6B:
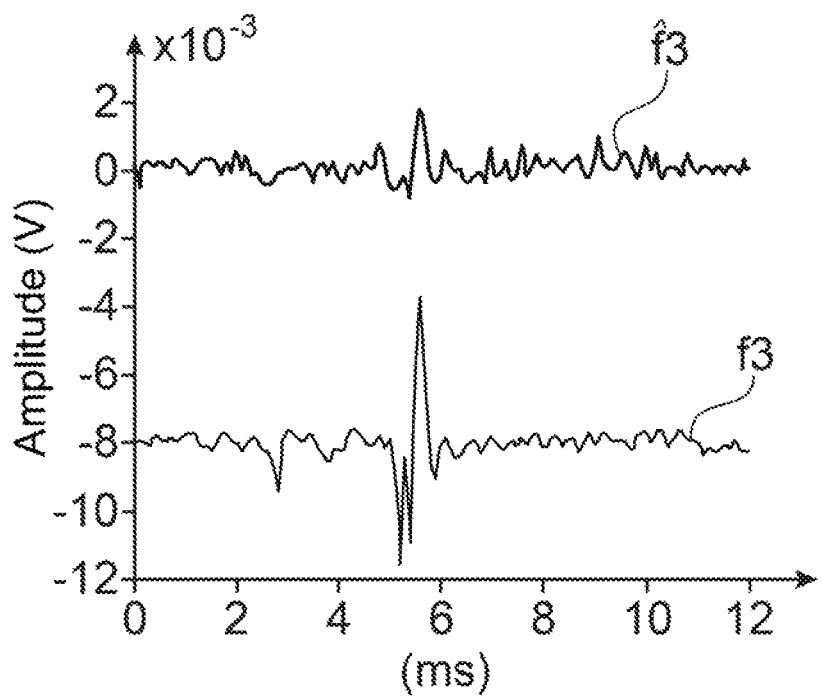
FIG. 6B is another view of the application of the pre-conditioning steps in FIG. 2 and of those in the flow-chart of FIG. 4 on different unknown acoustic signals, according to the invention.

More specifically, FIG. 6A shows an unknown acoustic signal S3 that is to be discriminated. FIG. 6B shows a sampled signal f3 resulting from the pre-conditioning steps (band-pass filtering, translation to base-band and low-pass filtering) as well as a sampled reconstruction signal $\hat{f}3$ resulting from the steps of the above flow-chart. The result of the iterative analysis on the sampled signal $f3$ shows that this signal is parsimonious, with a probability of parsimony (or of congruence) $P_L$ equal to 92% which is much greater than 50% (the threshold value $V_0$). This leads to a reliable conclusion that the unknown acoustic signal S3 is a signature of an electric arc.

Figure 7A:
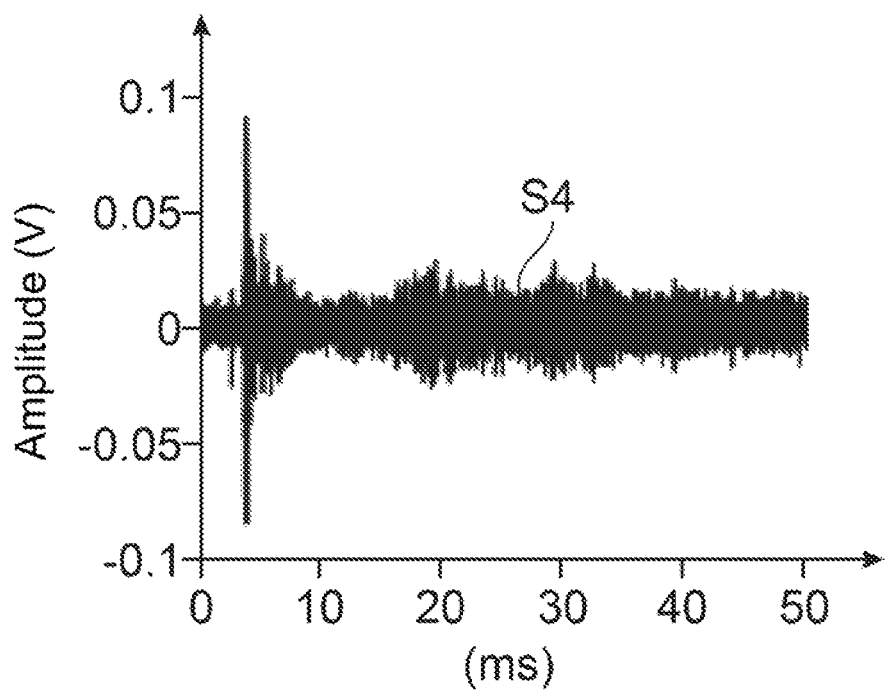
FIG. 7A is a further view of the application of the pre-conditioning steps in FIG. 2 and of those in the flow-chart of FIG. 4 on different unknown acoustic signals, according to the invention.
Figure 7B:
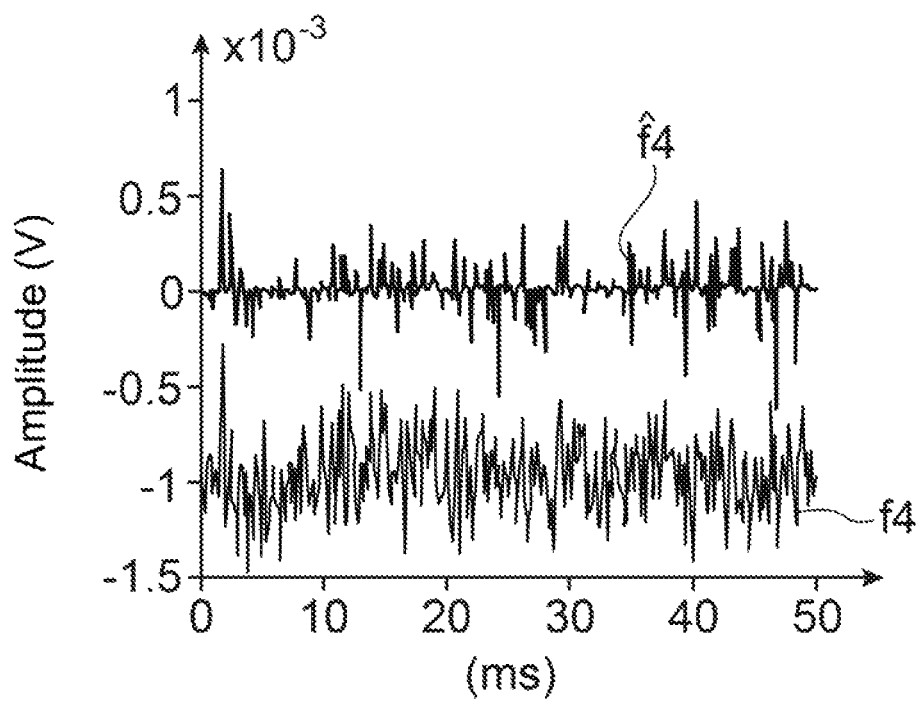
FIG. 7B is a still further view of the application of the pre-conditioning steps in FIG. 2 and of those in the flow-chart of FIG. 4 on different unknown acoustic signals, according to the invention.

The example in FIG. 7A shows another acoustic signal S4 that is to be discriminated. FIG. 7B shows a sampled signal $f4$ resulting from the pre-conditioning steps on the acoustic signal S4 as well as a sampled reconstruction signal $\hat{f}4$ resulting from the steps in the flow-chart on the sampled signal $f4$. The result of the analysis show that the probability of parsimony (or of congruence) $P_L$ of the sampled signal f4 is equal to 7% which is much lower than 50% (the threshold value). This leads to a reliable conclusion that the unknown acoustic signal S4 is not a signature of an electric arc, but rather the signature of a mechanical impact.

Figure 8A:
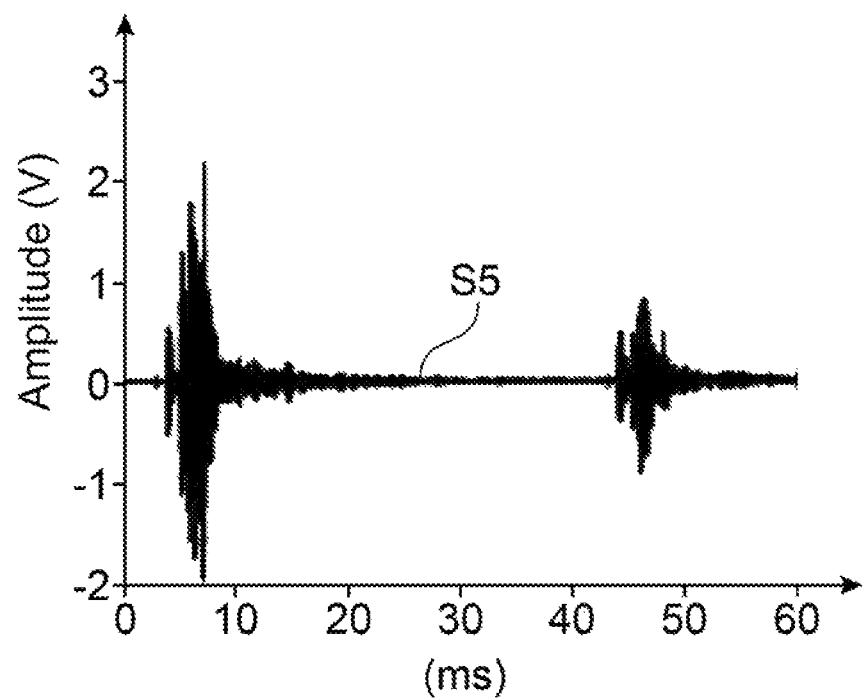
FIG. 8A is another view of the application of the pre-conditioning steps in FIG. 2 and of those in the flow-chart of FIG. 4 on different unknown acoustic signals, according to the invention.
Figure 8B:
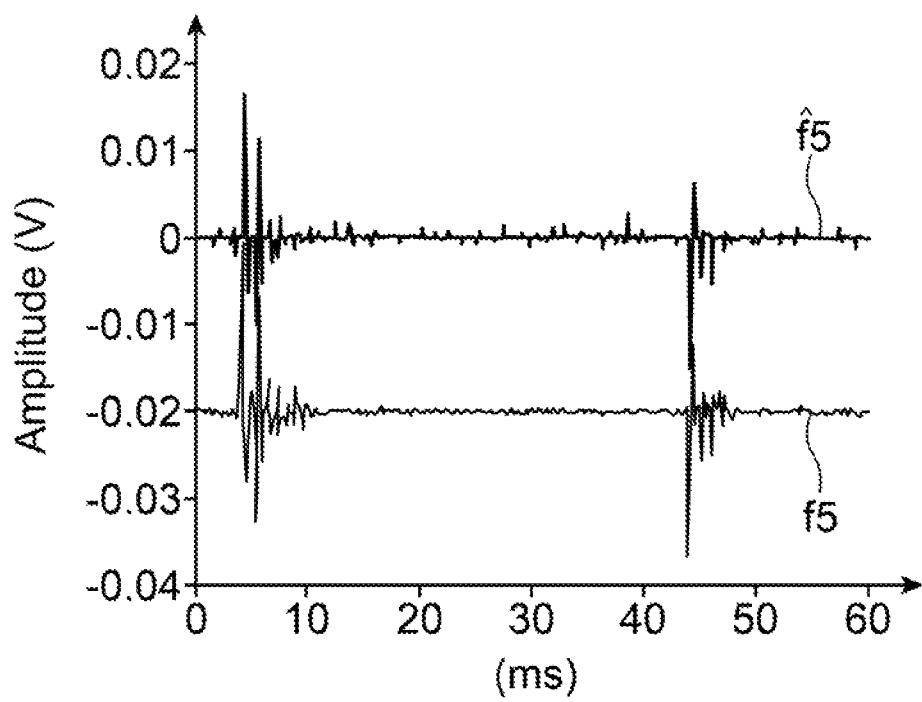
FIG. 8B is yet another view of the application of the pre-conditioning steps in FIG. 2 and of those in the flow-chart of FIG. 4 on different unknown acoustic signals, according to the invention.

The example in FIG. 8A shows a last unknown acoustic signal S5 that is to be discriminated. FIG. 8B shows a sampled signal f5 resulting from the pre-conditioning steps on the acoustic signal S5 as well as a sampled reconstruction signal f̂5 resulting from the steps in the flow-chart on the sampled signal f5. The result of the analysis shows that the sampled signal f5 is parsimonious, with a probability of parsimony (or of congruence) $P_L$ equal to 75% which is greater than 50% (the threshold value). This leads to a reliable conclusion that the unknown acoustic signal S5 is a signature of an electric arc, or more precisely the signature of two successive electric arcs.

The inventors have observed that the probability of parsimony (or of congruence) $P_L$ never exceeds 20% for mechanical impacts and remains greater than 50% for electric arcs even in the event of a succession of electric arcs (FIGS. 8A and 8B). The threshold value $V_0=50\%$ is thus particularly robust.

Figure 9:
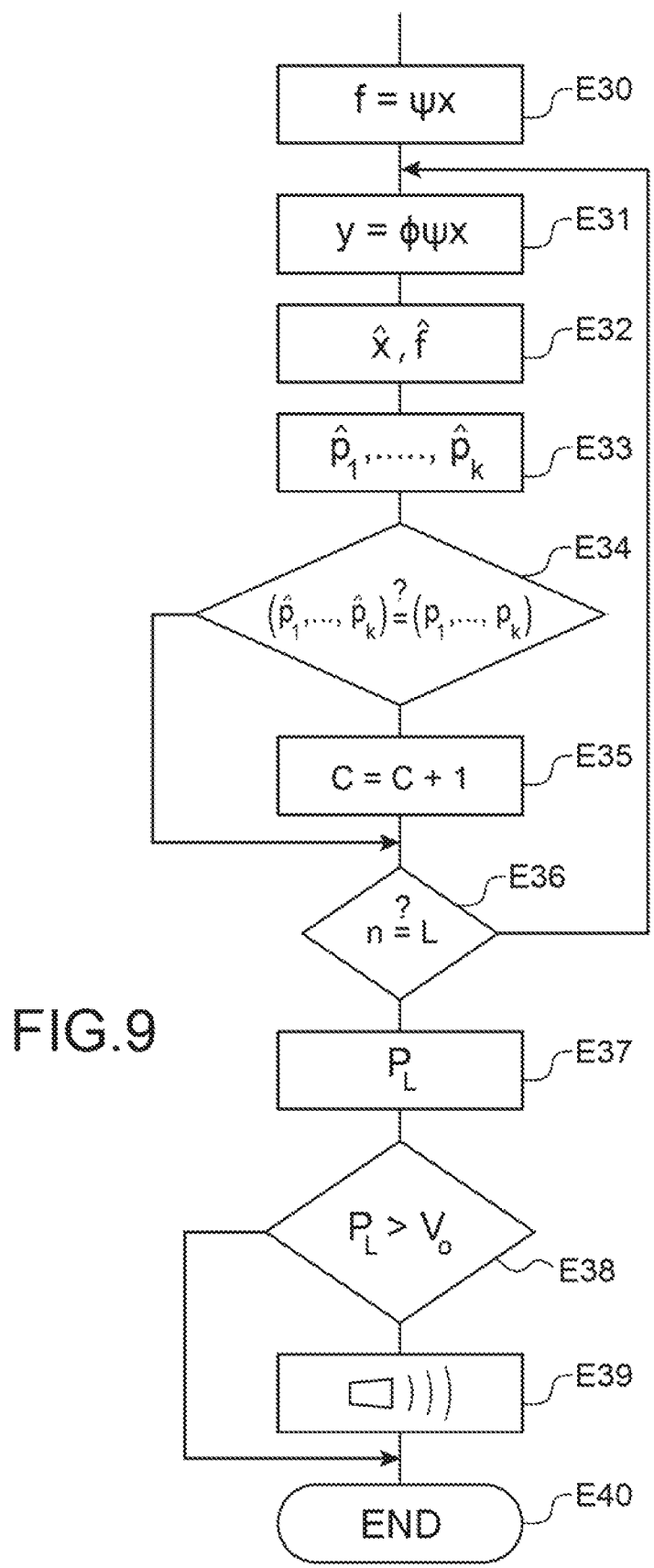
FIG. 9 is a flow chart showing a method for determining the parsimony measurement of the acoustic signal by the processor, according to another preferred embodiment of the invention.

FIG. 9 is a flow chart showing a method for determining the parsimony measurement of the acoustic signal by the processor, according to another preferred embodiment of the invention.

The flow-chart in FIG. 9 differs from that of FIG. 4A only by the fact that it comprises an additional step E30, given that steps E31 to E40 are almost identical to steps E1 to E10 of FIG. 4A.

The additional step E30 is designed to allow a sampled signal f which is not parsimonious in time (despite the fact that it is caused by an electric arc event), to be placed in a base in which this signal f can be expressed in a parsimonious manner. This very uncommon case may be due, for example, to electric arcs in very close succession.

In effect, at step E30, the processor 21 is configured to express the temporal sampled signal f in another orthonormal base (for example a frequency base, wavelet base etc.) in which it is parsimonious, by using a transfer matrix ψ (f=ψx). This transfer matrix ψ defines the coefficients of the sampled signal f as a function of the coefficients of a corresponding parsimonious signal or vector. In other words, the transfer matrix ψ chosen is such that the majority of the coefficients of the vector x are zero in the new base.

At step E31, the processor 21 is configured to iteratively compress (for a predetermined number of iterations L) the sampled signal f from $R^N$ (expressed as a function of the parsimonious vector x) by multiplying it at each iteration by a random acquisition matrix φ thus generating at each current iteration a current sub-sampled signal y of dimension M (where M<N) associated with a corresponding parsimonious vector x (i.e., y=φψx).

At step E32, the processor 21 is configured to calculate, at each current iteration, the coefficients of a current reconstruction vector x̂ which corresponds to the parsimonious vector x by seeking a solution to the following equation:

$$\hat{x}=\mathrm{argmin}_x \|x\|_1 \text{ such that } y=\varphi\psi x.$$

Moreover, because of the transfer matrix ψ, the processor 21 is configured to calculate a sampled reconstruction signal f̂ where f̂=ψx̂.

Steps E33 to E40 are the same as steps E3 to E10 of FIG. 4A (or where appropriate, to steps E23 to E20 of FIG. 4B). It can be seen that the method in FIG. 4A can be regarded as a specific case of that of FIG. 9 wherein the transfer matrix ψ is an identity application $1_d$ and where the vector x is identical to the sampled signal f. In effect, an acoustic signal caused by an electric arc is quasi-parsimonious in the temporal base wherein it is acquired and consequently it is almost unnecessary to project this signal onto another base before it is compressed (as proposed by the embodiment in FIG. 4A).

Figure 10:
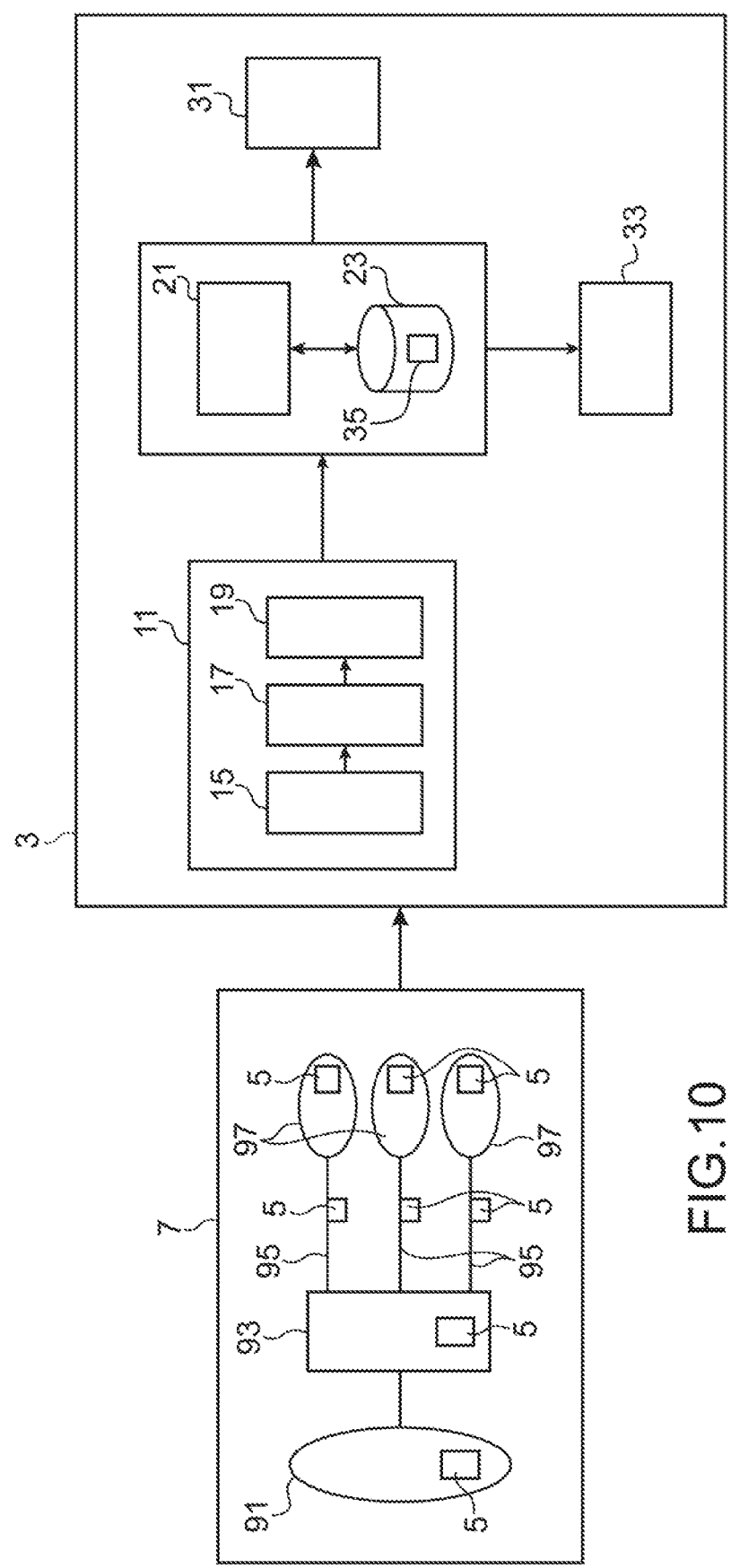
FIG. 10 schematically shows a system for detecting an electric arc in an electrical installation, according to a preferred embodiment of the invention.

FIG. 10 schematically shows a system for detecting an electric arc in an electrical installation, according to a preferred embodiment of the invention.

The electrical installation 7 is, for example, an electrical supply system comprising a set of elements comprising an electrical generator 91, a distribution board 93, electrical cables 95, as well as other connection elements and items of electrical equipment 97. It is moreover equipped with a set of acoustic sensors 5, each being arranged on a specific element.

As an example, the electrical supply system may be a system on board an aircraft. Furthermore it may be a direct current or alternating current supply system.

The analysis device 3 comprises a pre-conditioning circuit 11, a data-processing circuit 13, an output interface 31 and if necessary a safety module 33. The pre-conditioning circuit 11 is configured to transform each temporal acoustic signal detected by one of the sensors into a sampled signal f expressed in a temporal base, as described above with reference to FIG. 2.

The circuit 13 for processing data comprises a processor 21 and means of storage 23. The processor 21 is configured to calculate the parsimony probability of each sampled signal f and to detect the electric arc signatures as described above with reference to the above figures. When an electrical arc is detected, the processor 21 sends a detection signal to the output interface 31 as well as, if necessary, to the safety module 33.

The output interface 31 is capable of triggering an audible and/or visual alarm or of displaying information on a screen. Furthermore the safety module 33 may be capable of electrically isolating the defective element, or of reducing the electrical power, or of triggering any other action depending on the element that is affected and the type of application.

Advantageously the means of storage 23 comprise a correspondence table 35 between a first set of identifiers for the acoustic sensors 5 and a second set of identifiers of the electrical elements 91, 93, 95, 97 associated with the sensors. Because of this correspondence table 35 the analysis device 3 is thus capable of identifying the electrical element at the location at which the electrical arc is produced.

In effect, each of the flow-charts in FIGS. 4A, 4B and 9 may advantageously comprise an additional identification step after the step for detection of an electric arc. This step allows the electrical element generating the arc to be identified thanks to the identifier for the sensor that detected this arc and the identifier for the element associated with this sensor in accordance with the correspondence table 35.

The invention claimed is:

1. A system for detecting an electric arc in an electrical installation equipped with at least one sensor configured to detect temporal acoustic signals produced by the electrical installation, said system comprising:
   an analysis device configured to
   analyze a temporal acoustic signal (S) coming from said at least one sensor by associating with said temporal acoustic signal a corresponding parsimony measurement (m), a value of the parsimony measurement indicating whether or not the temporal acoustic signal is a signature of an electric arc, determine said parsimony measurement by sampling said temporal acoustic signal to form a sampled signal f, compressing the sampled signal to form a compressed signal and reconstructing the sampled signal from said compressed signal, and trigger an alarm when the value of the parsimony measurement indicates that the temporal signal is a signature of an electric arc, wherein the compressed signal is generated by iteratively multiplying the sampled signal at each current iteration with an acquisition matrix which differs at each iteration.

2. The detection system according to claim 1, wherein the analysis device comprises:

a pre-conditioning circuit configured to transform said temporal acoustic signal (S) into the sampled signal f, the sampled signal f of predetermined dimension N and which is expressed in a temporal base, a processor configured to determine the parsimony measurement of said temporal acoustic signal by calculating a parsimony probability of the sampled signal f, and detect whether said parsimony probability exceeds a predetermined threshold value, said exceeding of the threshold value being representative of a signature of an electric arc.

3. The detection system according to claim 2, wherein the acquisition matrix is a random acquisition matrix φ which differs at each iteration, and at each iteration multiplication of the sampled signal with the acquisition matrix forms a current sub-sampled signal y of dimension M where M<N, and said processor is further configured to:

calculate, from the current sub-sampled signal y, a current reconstruction sampled signal f̂ by seeking a solution which minimizes a predetermined norm 1_1 which measures the parsimony of the sampled signal, identify a predetermined number k of current estimated temporal positions p̂1, . . . , p̂k of a greatest amplitudes of the sampled reconstruction signal f̂;

determine the parsimony probability P_L of said sampled signal f by calculating a proportion of a number of iterations during which the estimated temporal positions p̂1, . . . , p̂k of the greatest amplitudes of the sampled reconstruction signal f̂ are concordant with a true temporal positions p̂1, . . . , p̂k of the greatest amplitudes of the sampled signal f, compare said parsimony probability P_L with said predetermined threshold value, said temporal acoustic signal being a signature of an electric arc if the parsimony probability P_L is greater than said predetermined threshold value.

4. The detection system according to claim 3, wherein said predetermined number k is equal to one and said processor is configured to:

identify a current estimated temporal position of the greatest amplitude of the sampled reconstruction signal f̂; and determine the parsimony probability P_L of said sampled signal f by calculating the proportion of the number of iterations during which each estimated temporal position of the greatest amplitude of the sampled reconstruction signal f̂ is concordant with the true temporal position of the greatest amplitude of the sampled signal f.

5. The detection system according claim 3, wherein said processor is configured to express the sampled signal f before the sampled signal f is compressed in another orthonormal base in which the sampled signal f is parsimonious, by using a transfer matrix.

6. The detection system according to claim 2, wherein the pre-conditioning circuit comprises:

a modulator configured to form a modulated acoustic signal by modulating said temporal acoustic signal according to a predetermined central frequency and a predetermined frequency band, a low-pass filter configured to form a filtered acoustic signal by performing low-pass filtering according to a predetermined cut-off frequency on said modulated acoustic signal, and a sampler configured to sample the filtered acoustic signal at a sampling frequency equal to or greater than double the cut-off frequency thus forming said sampled signal f.

7. The detection system according to claim 6, wherein said at least one sensor is selected such that a gain diagram of the at least one sensor exhibits a maximum gain within the predetermined frequency band.

8. The detection system according to claim 6, wherein said modulator is configured to form the modulated acoustic signal by performing band-pass filtering on the temporal acoustic signal according to the predetermined frequency band and by multiplying the temporal acoustic signal by a cosine function of the predetermined central frequency and zero phase-shift.

9. The detection system according to claim 6, wherein the determined central frequency has a value between 30 kHz and 200 kHz and preferably equal to about 100 kHz, where the predetermined frequency band has a value between 10 kHz and 50 kHz and preferably equal to about 20 kHz, where the cut-off frequency is about 5 kHz, and where the sampling frequency is about 10 kHz.

10. The detection system according to claim 1, wherein the electrical installation comprises a set of electrical elements, each equipped with a specific sensor to allow the electrical element at the location at which the electric arc is produced to be identified.

11. A method for detecting an electric arc in an electrical installation equipped with at least one sensor configured to detect temporal acoustic signals produced by the electrical installation, said method comprising:

analyzing a temporal acoustic signal coming from said at least one sensor by associating with said temporal acoustic signal a corresponding parsimony measurement, a value of the parsimony measurement indicating whether or not the temporal acoustic signal is a signature of an electric arc; and triggering an alarm when the value of the parsimony measurement indicates that the temporal signal is a signature of an electric arc, wherein said analyzing comprises forming a sampled signal by sampling of said temporal acoustic signal, forming a compressed signal by compressing the sampled signal, and reconstructing the sampled signal from said compressed signal, and the compressed signal is generated by iteratively multiplying the sampled signal at each current iteration with an acquisition matrix which differs at each iteration.

* * * * *